United States Patent
Cho et al.

(10) Patent No.: US 7,838,361 B2
(45) Date of Patent: Nov. 23, 2010

(54) METHOD FOR FABRICATING RECESS GATE IN SEMICONDUCTOR DEVICE

(75) Inventors: Yong-Tae Cho, Icheon-si (KR); Eun-Mi Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 111 days.

(21) Appl. No.: 12/239,492

(22) Filed: Sep. 26, 2008

(65) Prior Publication Data

US 2009/0087960 A1   Apr. 2, 2009

(30) Foreign Application Priority Data

Sep. 28, 2007   (KR) .................. 10-2007-0098221

(51) Int. Cl.
*H01L 21/336* (2006.01)
(52) U.S. Cl. .................. 438/259; 439/294; 439/700; 257/396; 257/589
(58) Field of Classification Search .......... 438/259, 438/294, 295, 700; 257/396, 589, E21.616, 257/E27.06
See application file for complete search history.

(56) References Cited

U.S. PATENT DOCUMENTS

| 2008/0128799 A1* | 6/2008 | Park et al. ............ 257/330 |
| 2008/0132074 A1* | 6/2008 | Kim ..................... 438/700 |
| 2008/0160698 A1* | 7/2008 | Lee ...................... 438/270 |
| 2008/0160742 A1* | 7/2008 | Cho et al. ............ 438/589 |

FOREIGN PATENT DOCUMENTS

KR   1020060118072 A   11/2006

* cited by examiner

*Primary Examiner*—Phuc T Dang
(74) *Attorney, Agent, or Firm*—Townsend and Townsend and Crew LLP

(57) ABSTRACT

A method for fabricating a recess gate in a semiconductor device includes etching a silicon substrate to form a trench that defines an active region, forming a device isolation layer that gap-fills the trench, forming a hard mask layer over the silicon substrate, the hard mask layer comprising a stack of an oxide layer and an amorphous carbon layer, wherein the hard mask layer exposes a channel target region of the active region, and forming a recess region with a dual profile by first etching and second etching the channel target region using the hard mask layer as an etch barrier, wherein the second etching is performed after removing the amorphous carbon layer.

23 Claims, 8 Drawing Sheets

METHOD FOR FABRICATING RECESS GATE IN SEMICONDUCTOR DEVICE

CROSS-REFERENCE TO RELATED APPLICATIONS

The present invention claims priority of Korean patent application number 2007-0098221, filed on Sep. 28, 2007, which is incorporated by reference in its entirety.

BACKGROUND OF THE INVENTION

The present invention relates to semiconductor device fabrication, and more particularly, to a method for fabricating a recess gate in a semiconductor device.

In the fabrication of a semiconductor device, a planar gate forming method is used to form a gate on a planar active region. However, the channel length decreases due to a reduction in the pattern size and the electric field increases due to an increase in the ion implant doping concentration of the substrate, thus causing a junction leakage. This makes it difficult to obtain the refresh characteristics of the device.

In order to solve the above limitation, a three-dimensional recess gate process has been proposed as an alternative gate forming method that forms a gate after etching an active region. The recess gate process makes it possible to increase the channel length and reduce the ion implant doping concentration, thus improving the refresh characteristics of the device.

Figure 1A:
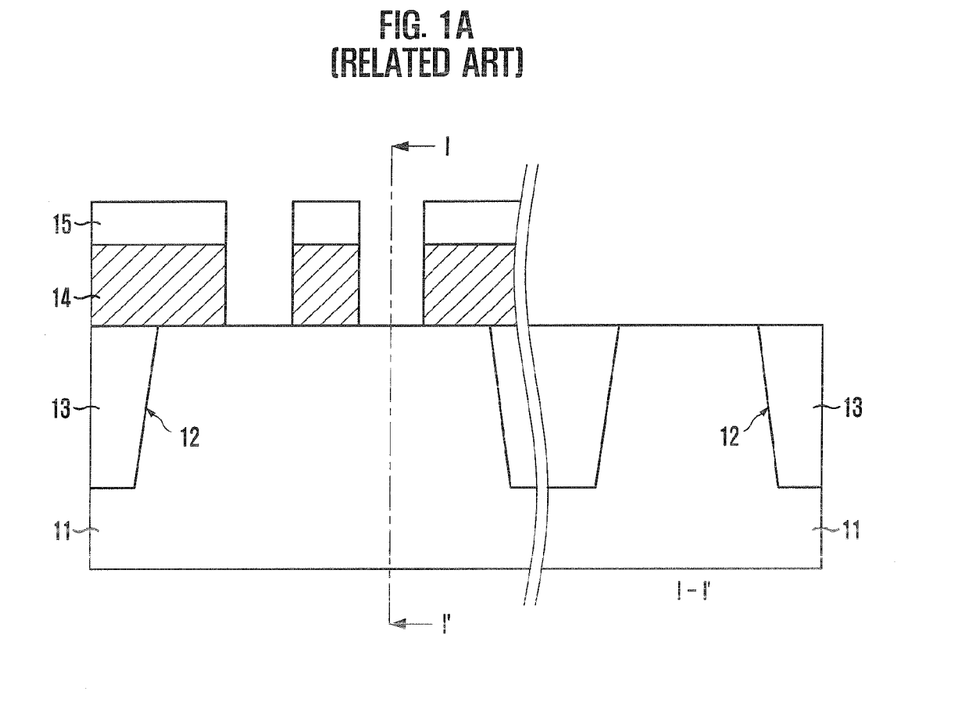
FIGS. 1A to 1C illustrate a method for fabricating a recess gate in a semiconductor device in accordance with the conventional art.
Figure 1B:
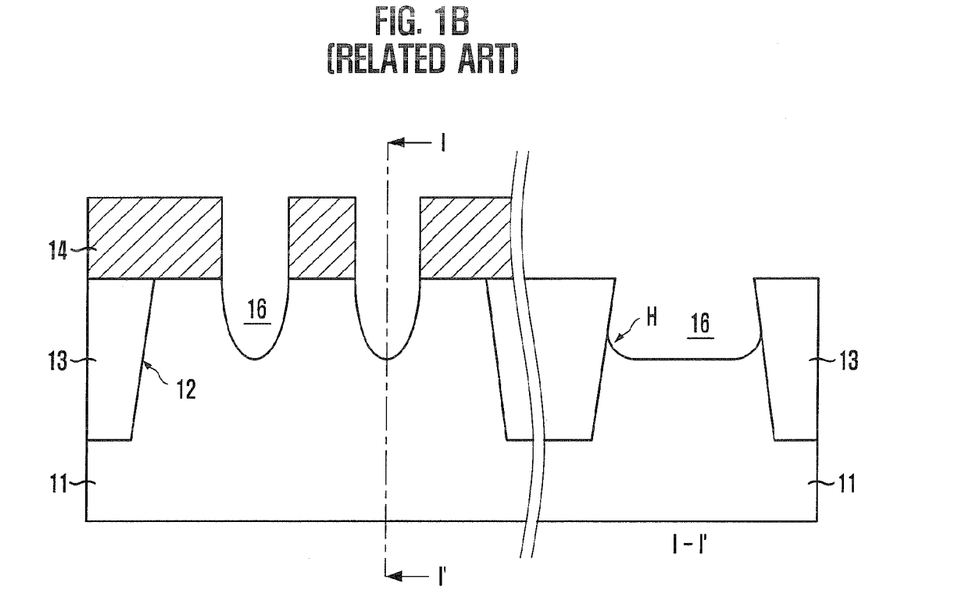
Figure 1C:
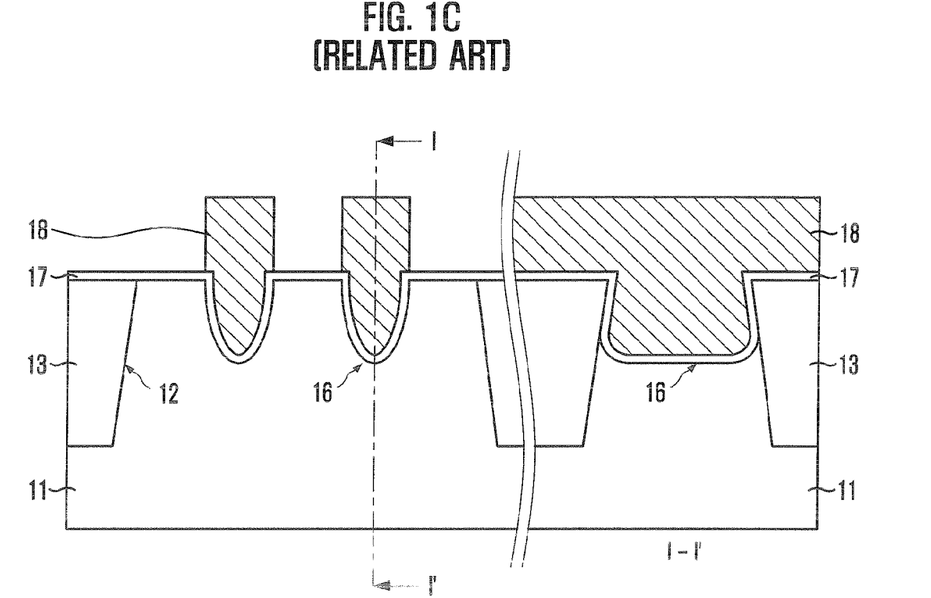

FIGS. 1A to 1C illustrate a method for fabricating a recess gate in a semiconductor device in accordance with the conventional art. Herein, the right portion of each figure is a cross-sectional view taken along line I-I'.

Referring to FIG. 1A, a device isolation region of a silicon substrate 11 is etched to form a trench 12, and a device isolation layer 13 is formed in the trench 12. This process is called a Silicon Trench Isolation (STI) process.

An amorphous carbon layer 14 is formed on the resulting structure and a mask process for formation of a recess region is performed on the amorphous carbon layer 14, thereby forming a photoresist pattern 15.

The amorphous carbon layer 14 is etched using the photoresist pattern 15 as an etch barrier.

Referring to FIG. 1B, using the amorphous carbon layer 14 as an etch barrier, the silicon substrate 11 is etched to form a recess region 16 that serves as a channel of a transistor. The recess region 16 is also called a recess channel.

Referring to FIG. 1C, a gate insulating layer 17 is formed on the silicon substrate 11 including the recess region 16. A conductive layer is deposited on the gate insulating layer 17 until the recess region 16 is filled, and the deposited conductive layer is etched to form a gate electrode 18.

However, during the ultrafine patternization process of the semiconductor device, a bottom profile of the recess region 16 forms a V-shaped profile in a plasma etching process due to a decrease in the size capable of forming a recess region of a three-dimensional recess gate. This causes a horn effect in which a silicon (Si) residue, referred to as horn H, resides in an upper region adjacent to the device isolation layer 13. The silicon residue is generated by a polymer obtained by redeposition of the carbon of the amorphous carbon layer.

Figure 2:
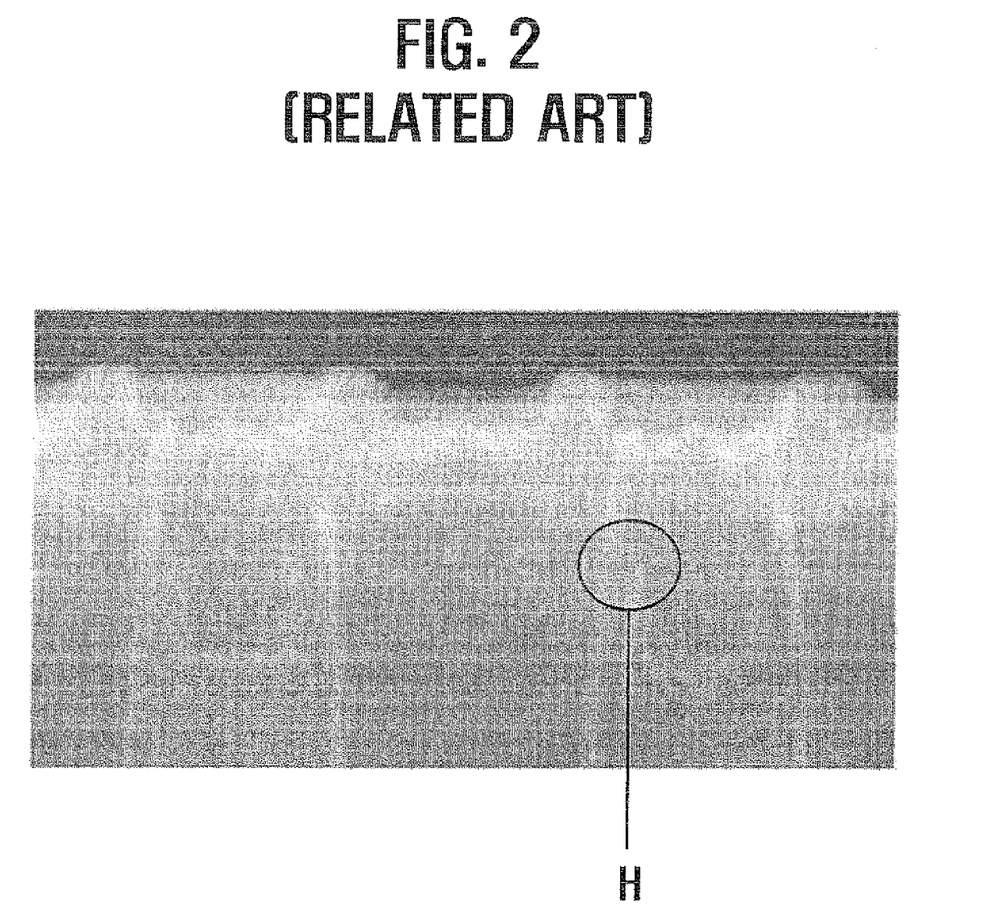
FIG. 2 illustrates an SEM picture showing horns in accordance with the conventional art.

FIG. 2 illustrates a Scanning Electron Microscope (SEM) picture showing horns in accordance with the conventional art. It can be seen from FIG. 2 that the horns reside in an upper region adjacent to a device isolation layer.

The horn H causes degradation of the gate insulating layer 17. The horn H is a stress concentration point and acts as a leakage current source, thereby reducing the device production yield and making it difficult to manufacture DRAMs.

Figure 3:
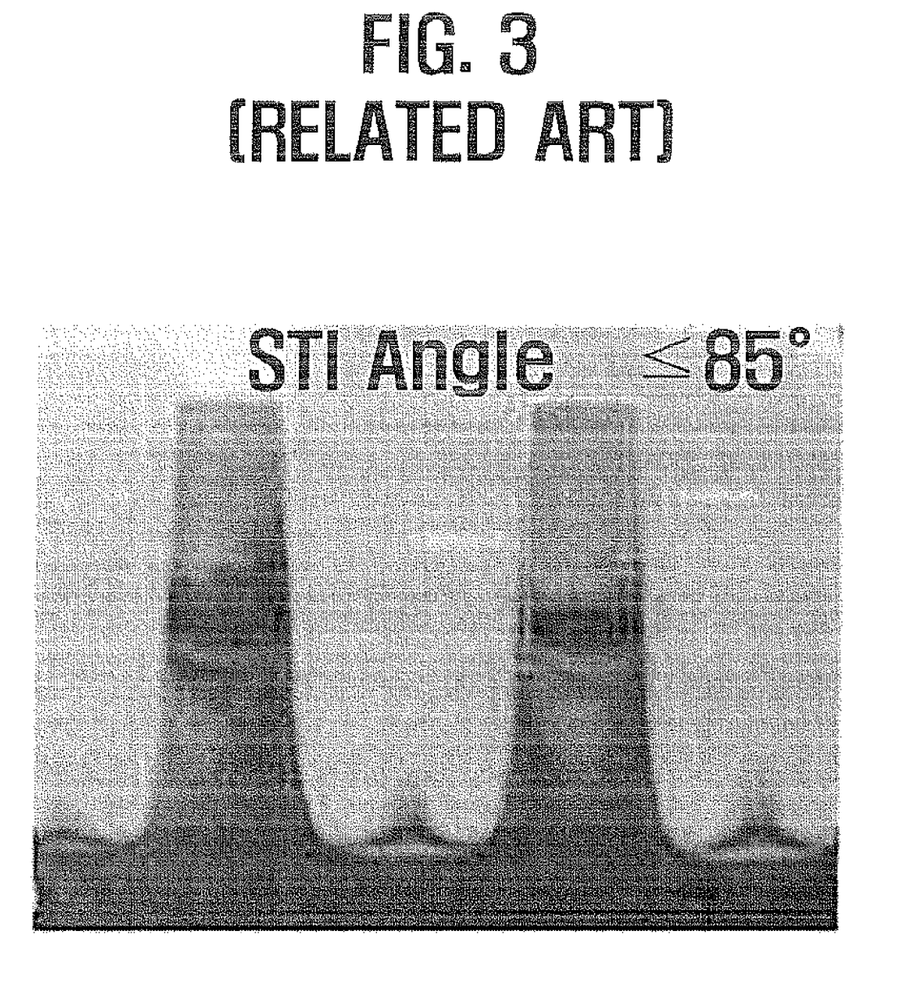
FIG. 3 illustrates an SEM picture showing a sidewall angle of a trench that is gap-filled with a device isolation layer in accordance with the conventional art.

The horn H is caused by the V-shaped profile of the recess region 16 that is formed when the sidewall of the trench 12, which is gap-filled with the device isolation layer 13, is formed at an angle of approximately 90° or less (see FIG. 3).

FIG. 3 illustrates an SEM picture showing a sidewall angle of a trench that is gap-filled with a device isolation layer in accordance with the conventional art. It can be seen from FIG. 3 that the trench is formed at an angle of approximately 90° or less.

SUMMARY OF THE INVENTION

Embodiments of the present invention are directed to providing a method for fabricating a recess gate in a semiconductor device, which can suppress generation of a horn in an etching process of a recess region during a recess gate formation process.

Embodiments of the present invention are also directed to providing a method for forming a recess channel in a semiconductor device, which can further increase the channel length while reducing the line width of the recess channel.

In accordance with an aspect of the present invention, a method for fabricating a recess gate in a semiconductor device is provided. The method includes: etching a silicon substrate to form a trench that defines an active region; forming a device isolation layer that gap-fills the trench; forming a hard mask layer over the silicon substrate, the hard mask layer comprising a stack of an oxide layer and an amorphous carbon layer, wherein the hard mask layer exposes a channel target region of the active region; and forming a recess region with a dual profile by first etching and second etching the channel target region using the hard mask layer as an etch barrier, wherein the second etching is performed after removing the amorphous carbon layer.

In accordance with another aspect of the present invention, a method for forming a recess channel in a semiconductor device is provided. The method includes: forming a hard mask layer over a semiconductor substrate, the hard mask layer comprising a stack of a passivation layer and an amorphous carbon layer, wherein the hard mask layer exposes a channel target region of the semiconductor substrate; etching the channel target region using the amorphous carbon layer as an etch barrier to form a first recess region; removing the amorphous carbon layer; and etching a bottom of the first recess region using the passivation layer as an etch barrier to form a second recess region.

In accordance with another aspect of the present invention, a method for fabricating a recess gate in a semiconductor device is provided. The method includes: etching a silicon substrate to form a trench that defines an active region; forming a device isolation layer in the trench; forming a hard mask layer over the silicon substrate, the hard mask layer comprising an oxide layer and an amorphous carbon layer, wherein the hard mask layer exposes a channel target region of the active region; first etching the channel target region using the amorphous carbon layer as an etch barrier to form a first recess region; removing the amorphous carbon layer; second etching a bottom of the first recess region using the oxide layer as an etch barrier to form a second recess region, wherein the second recess region is wider than the first recess region.

In accordance with another aspect of the present invention, a method for forming a recess channel in a semiconductor device is provided. The method includes: forming a hard mask layer over a semiconductor substrate, the hard mask layer comprising a passivation layer and an amorphous carbon layer, wherein the hard mask layer exposes a channel target region of the semiconductor substrate; etching the channel target region using the amorphous carbon layer as an etch barrier to form a first recess region; removing the amorphous carbon layer; and etching a bottom of the first recess region using the passivation layer as an etch barrier to form a second recess region, wherein the second recess region is wider than the first recess region.

DESCRIPTION OF SPECIFIC EMBODIMENTS

Hereinafter, a method for fabricating a recess gate in a semiconductor device in accordance with the present invention will be described in detail with reference to the accompanying drawings.

It will be understood that when an element such as a layer, a film, a pattern and a region is referred to as being 'on/under' another element herein, it may be directly on/under the other element, and one or more intervening elements may also be present.

In the embodiments of the present invention, a hard mask layer with a stack of a passivation layer, e.g., an oxide layer, and an amorphous carbon layer is used as an etch barrier in a recess etching process for forming a recess region or a recess channel. The recess etching process includes a first recess etching process using an amorphous carbon layer as an etch barrier and a second recess etching process using a passivation layer as an etch barrier. The first recess etching process and the second recess etching process are performed using the same etch gas, the same pressure, the same source power, and the same bias power, and the amorphous carbon layer is removed in advance before the second recess etching process is performed. In other words, the second recess etching process is performed without the presence of the amorphous carbon layer. In this case, an amount of polymer generated in the second recess etching process is smaller than that in the first recess etching process. Therefore, it is possible to form a wider recess region and to prevent a horn from being generated in a region adjacent to a device isolation layer.

FIGS. 4A to 4F illustrate a method for fabricating a recess gate in a semiconductor device in accordance with an embodiment of the present invention. Herein, the right portion of each figure is a cross-sectional view taken along line II-II'.

Figure 4A:
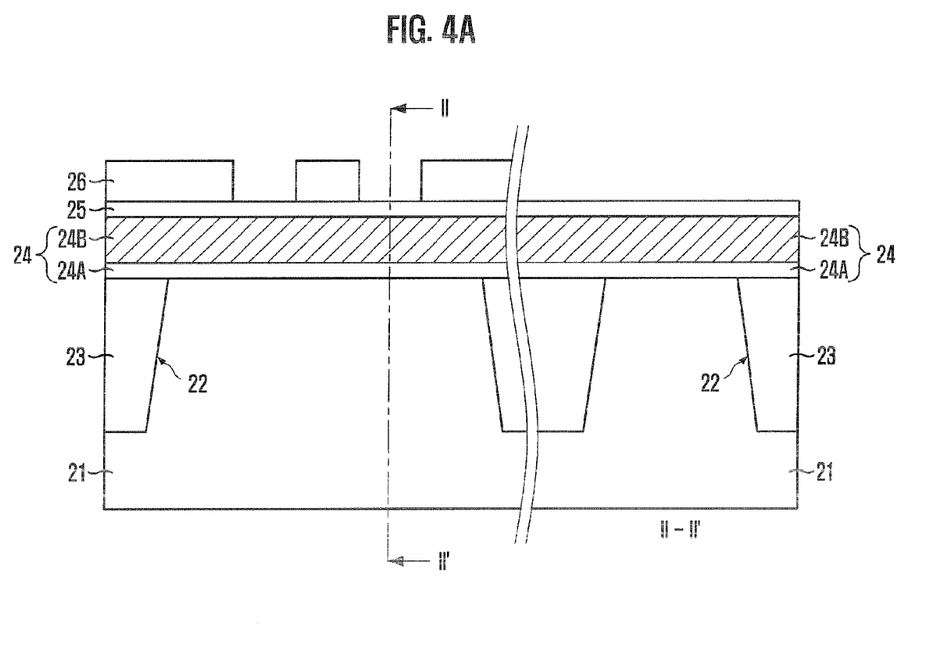
FIGS. 4A to 4F illustrate a method for fabricating a recess gate in a semiconductor device in accordance with an embodiment of the present invention.

Referring to FIG. 4A, a Shallow Trench Isolation (STI) process is used to form a device isolation layer 23 filling a trench 22 in a silicon substrate 21. An active region is defined by the trench 22, and the trench 22 may be formed at an angle of approximately 90° or less.

A hard mask layer 24 is formed on the silicon substrate 21. The hard mask layer 24 may include an oxide layer or an amorphous carbon layer. Preferably, the hard mask layer 24 may include a stack of an oxide layer 24A and an amorphous carbon layer 24B. The oxide layer 24A also serves as a passivation layer that protects the surface of the silicon substrate 21.

An Anti-Reflective Coating (ARC) layer 25 is formed on the hard mask layer 24, and a mask process for formation of a recess region is performed on the resulting structure to form a photoresist pattern 26. The ARC layer 25 may be an Organic Bottom Anti-Reflective Coating (OBARC) layer.

Figure 4B:
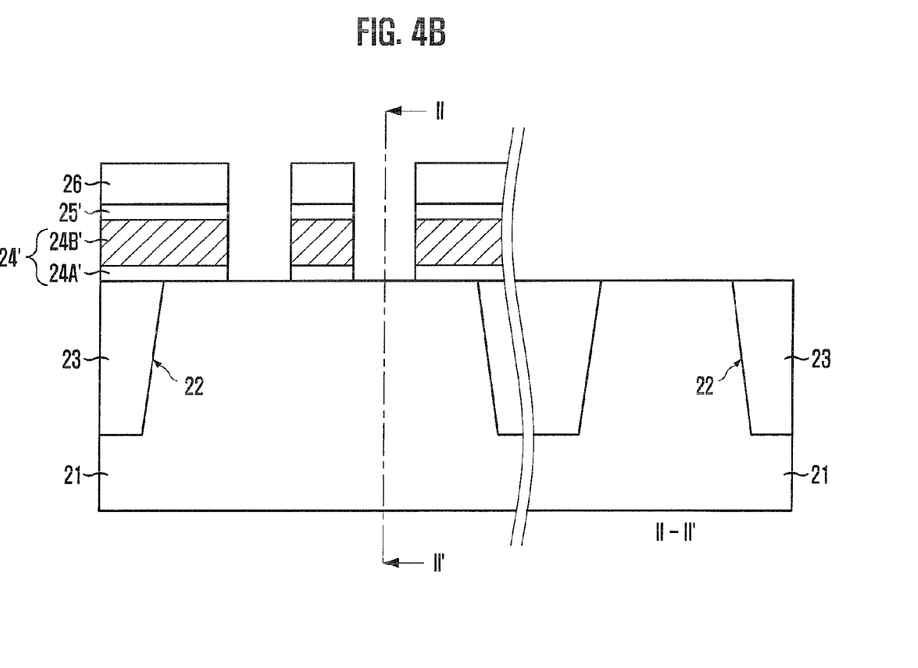

Referring to FIG. 4B, the ARC layer 25 and the hard mask layer 24 are etched using the photoresist pattern 26 as an etch barrier. These etching processes are performed using a plasma source such as a Capacitively Coupled Plasma (CCP) type or a Magnetically Enhanced Reactive Ion Etching (MERIE) type. The ARC layer 25 and the amorphous carbon layer 24B are etched using plasma having a mixture of $N_2$ gas and $O_2$ gas, and by applying a source power and a bias power simultaneously. The amorphous carbon layer 24B is etched using the oxide layer 24A as an etch stop layer. Thereafter, the oxide layer 24A is etched using plasma having a mixture of $O_2$ gas and one of $CF_x$ (e.g., $CF_4$) gas and $CHF_x$ (e.g., $CHF_3$) gas.

Figure 4C:
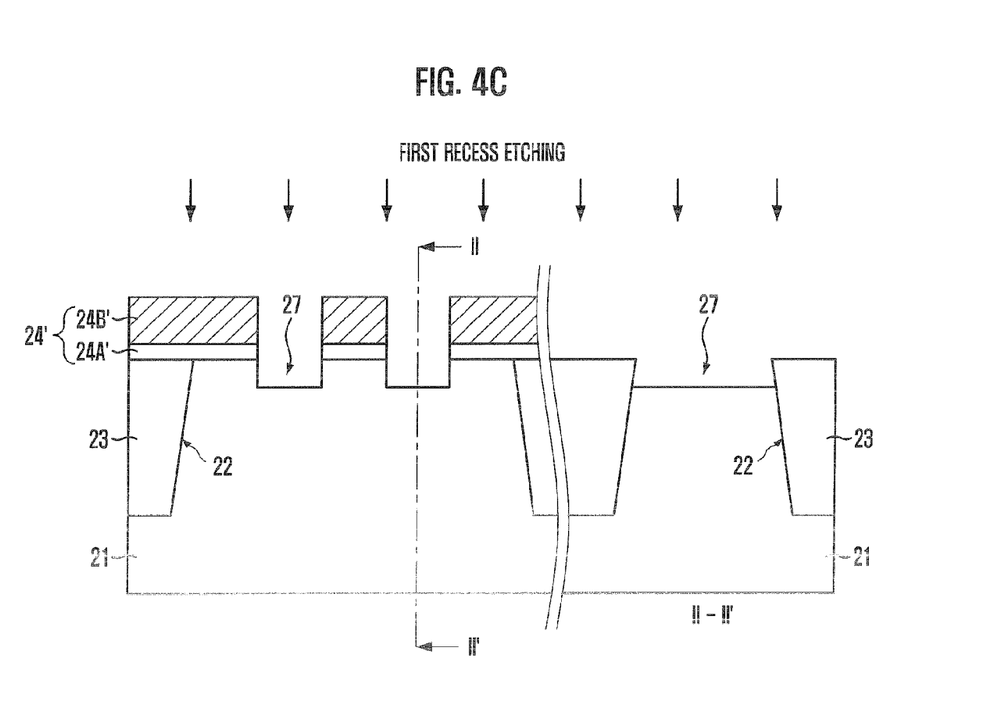

Referring to FIG. 4C, the photoresist pattern 26 and the remaining ARC layer 25' are removed. Using the remaining amorphous carbon layer 24B' as an etch barrier, a first recess etching process is performed to etch the silicon substrate 21 to a predetermined depth. A first recess region 27 is formed by the first recess etching process. The first recess etching process is performed using Transformer Coupled Plasma (TCP) or Inductively Coupled Plasma (ICP) as a plasma source and using a mixture of chlorine-based gas and bromine-based gas. For example, it is preferable that the first recess etching process is performed at an $HBr$-to-$Cl_2$ flow rate ratio of approximately 5:1, by applying a pressure of approximately 5 mtorr to approximately 20 mtorr, a source power of approximately 500 W to approximately 1500 W, and a bias power of approximately 100 V to approximately 300 V.

By the above-described first recess etching process, the first recess region 27 has a vertical profile and has a depth of approximately 200 Å to approximately 500 Å. In another embodiment, the first recess etching process may be performed in situ in a chamber that was used to etch the amorphous carbon layer 24B.

Figure 4D:
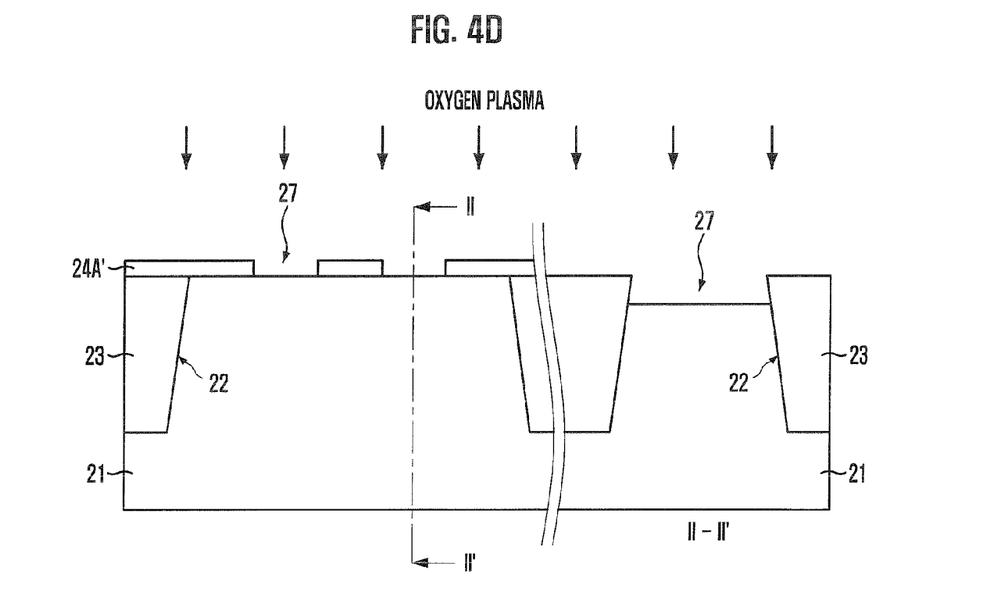

Referring to FIG. 4D, the remaining amorphous carbon layer 24B' is removed in situ in an etching apparatus that was used to perform the first recess etching process. To this end, approximately 200 sccm to approximately 1000 sccm of $O_2$ plasma is used and a source power is applied without applying a bias power.

Figure 4E:
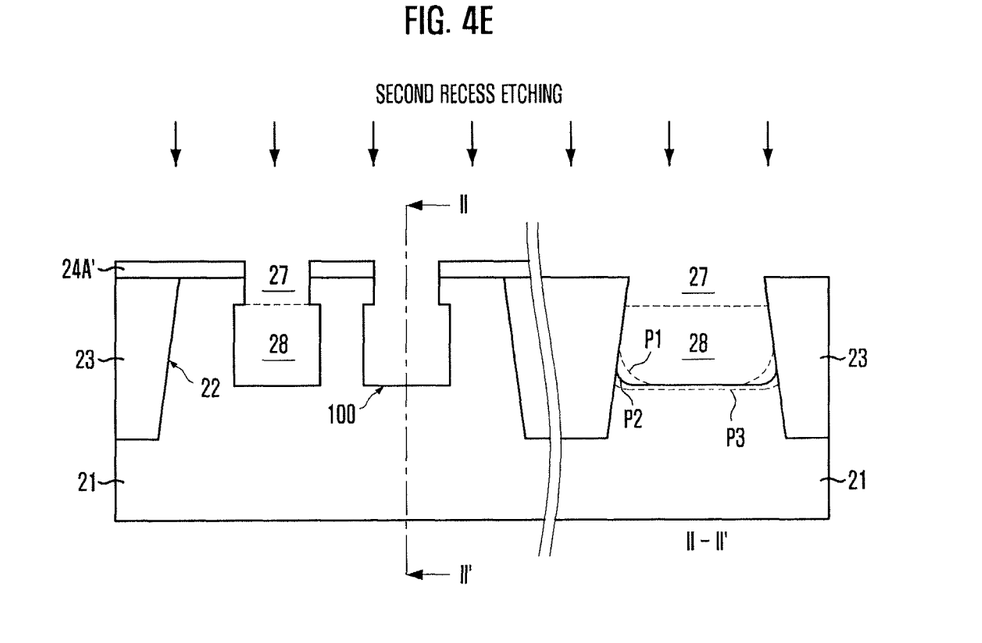

Referring to FIG. 4E, using the remaining oxide layer 24A' as an etch barrier, a second recess etching process is performed to etch a bottom of the first recess region 27, thereby forming a second recess region 28. Herein, the second recess etching process is performed in situ in the etching apparatus that was used to perform the first recess etching process and to remove the remaining amorphous carbon layer 24B'. For example, the second recess etching process may be performed under a TCP or ICP type of plasma source by using a mixture of chlorine-based gas and bromine-based gas. For example, it is preferable that the second recess etching process is performed by applying a pressure of approximately 10 mtorr to approximately 30 mtorr, a source power of approximately 500 W to approximately 1500 W, and a bias power of approximately 100 V to approximately 300 V. In particular, if HBr and Cl$_2$ are used respectively as bromine-based gas and chlorine-based gas, it is preferable that an HBr-to-Cl$_2$ flow rate ratio is approximately 5:1. The second recess region 28, formed by etching the bottom of the first recess region 27 under the above etching conditions, has a profile that gradually widens as a depth of the second recess region 28 increases. Preferably, the second recess region 28 is formed deeper than the first recess region 27, for example, to a thickness of approximately 700 Å to approximately 1000 Å.

According to the above-described processes, the first recess region 27 and the second recess region 28 constitute a recess region 100 that has a dual profile that has different top and bottom profiles.

The first recess region 27 and the second recess region 28 have different profiles for the following reasons.

Because the first recess region 27 is etched using the remaining amorphous carbon layer 24B' as an etch barrier, a large amount of polymer is generated due to the carbon of the remaining amorphous carbon layer 24B'. The generated polymer is redeposited so that the etching profile has a vertical profile.

On the other hand, the second recess region 28 is formed after removing the remaining amorphous carbon layer 24B' and a relatively small amount of polymer is generated due to the carbon. Thus, because there is no etching obstacle due to the carbon polymer, the second recess region 28 is wider than the first recess region 27.

That is, the second recess region 28 is etched more than the first recess region 27. Thus, generation of a horn in a region adjacent to the device isolation layer 23 can be suppressed, and even if a horn is generated, its height can be reduced considerably.

The recess region 100 with a dual profile has a widening profile in which a bottom width is greater by approximately several tens of nanometers than that of the conventional recess region. Thus, unlike the conventional art, it is possible to form the recess region with a minimized horn. Referring again to FIG. 4E, a reference symbol 'P1' denotes a conventional profile and a reference symbol 'P2' denotes a profile according to an embodiment of the present invention. It can be seen from FIG. 4E that the profile according to the embodiment of the present invention has a considerably lower horn than the conventional profile.

Among the second recess etching conditions for formation of the widened second recess region 28, a pressure, a power and a gas ratio are very important. Preferably, the second recess etching process is performed by applying a pressure of approximately 10 mtorr to approximately 30 mtorr, a source power of approximately 500 W to approximately 1500 W, and a bias power of approximately 100 V to approximately 300 V.

In another embodiment, after formation of the second recess region 28, a third recess etching process may be additionally performed to further widen the width of the second recess region 28. The third recess etching process is performed in situ. For example, the third recess etching process may be performed using TCP or ICP as a plasma source, and by using a mixture of HBr/Cl$_2$ gas and a small amount of SF$_6$/O$_2$ gas. Preferably, the third recess etching process is performed by applying a pressure of approximately 20 mtorr to approximately 100 mtorr, a source power of approximately 500 W to approximately 1500 W, and a bias power of approximately 50 W or less. The third recess etching process is performed using a mixture of chlorine-based gas and fluorine-based gas and a mixture of a small amount of oxygen gas and fluorine-based gas. The fluorine-based gas may be nitrogen fluoride (NF$_x$) gas or carbon fluoride (CF$_x$) gas, as well as sulfur fluoride gas such as SF$_6$ gas. The nitrogen fluoride gas may be NF$_3$ gas, and the carbon fluoride gas may be CF$_4$ gas. The fluorine-based gas and the oxygen gas are used to induce isotropic etching, and accordingly, the second recess region 28 can be further widened by the third recess etching process.

When the third recess etching process is performed under the above-described etching conditions, the second recess region 28 can be further widened by approximately 10 nm to approximately 15 nm, for example. Referring again to FIG. 4E, a reference symbol 'P3' denotes a widened profile resulting from the third etching process according to an embodiment of the present invention. When the third recess etching process is performed, the height of a horn can be further reduced.

The first recess etching process and the second recess etching process according to the above-described embodiment are performed with high-density etching equipment using TCP or ICP as a plasma source. In another embodiment, the first recess etching process and the second recess etching process may be performed in an ICP-type etching apparatus mounted with a Faraday shield. Also, the first recess etching process and the second recess etching process may be performed in an etching apparatus using one of Microwave Down Stream (MDS), Electron Cyclotron Resonance (ECR), and Helical as a plasma source.

Figure 4F:
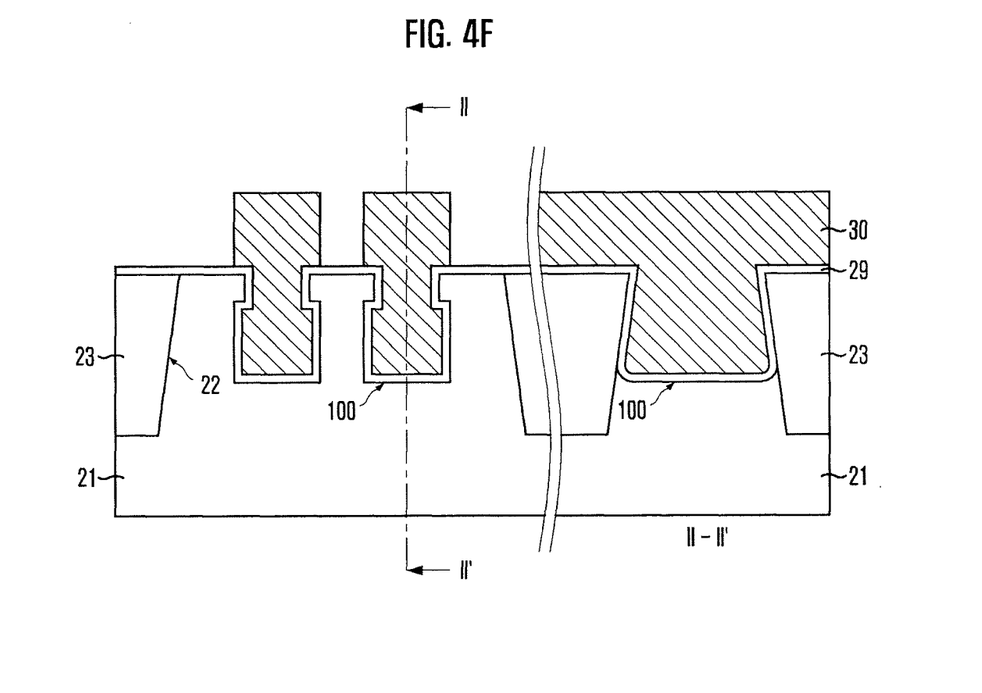

Referring to FIG. 4F, the remaining oxide layer 24A' is removed and a gate insulating layer 29 is formed on the silicon substrate 21 including the recess region 100. Thereafter, a conductive layer is deposited on the gate insulating layer 29 until the recess region 100 is filled, and the resulting structure is etched to form a gate electrode 30. Accordingly, the recess region 100 under the gate electrode becomes a recess channel of a transistor.

Figure 5:
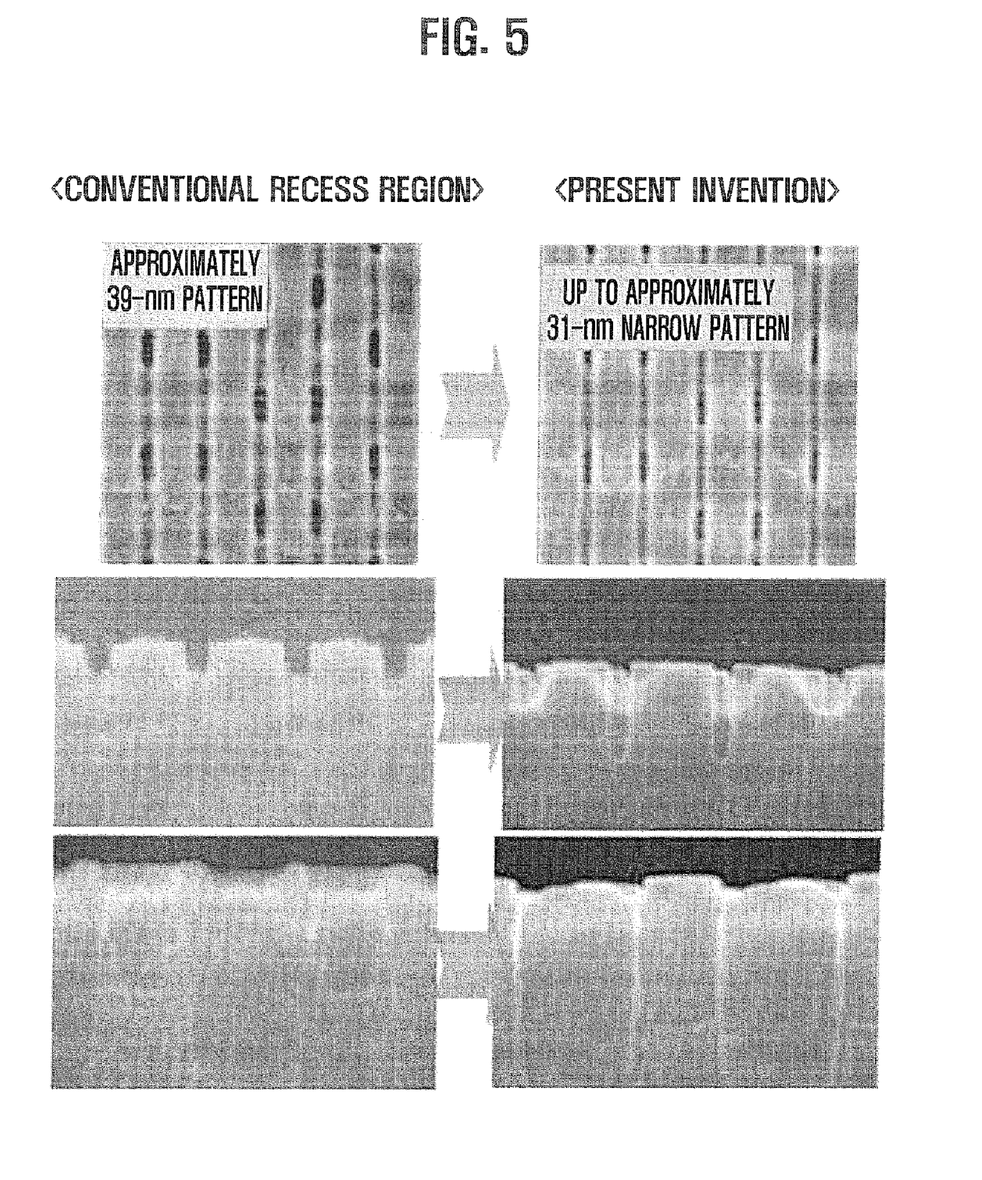
FIG. 5 illustrates an SEM picture showing a horn and a profile of a recess region in accordance with an embodiment of the present invention.

FIG. 5 illustrates an SEM picture showing the horn and the profile of a recess region in accordance with an embodiment of the present invention.

Referring to FIG. 5, it can be seen that a horn according to the present invention is considerably lower than the conventional horn. Also, it can be seen that the recess region 100 has a dual profile instead of a pointed profile. Accordingly, the size of the horn can be minimized even when the trench filled with the device isolation layer is formed at an angle of approximately 90° or less. Since the second recess region is widened by the second recess etching process, the present invention can increase the channel length even when the first recess region is formed to have a smaller line width. When the line width of the first recess region is reduced, misalignment with a gate electrode can be prevented. For reference, while the conventional art forms the line width of the recess region to be approximately 39 nm, the present invention can reduce the line width of the recess region to be approximately 31 nm.

As a result, the horn is minimized, the leakage current is suppressed, and the refresh characteristics of the device are improved. Therefore, device fabrication yield can be improved and fabrication costs can be reduced.

The optimal etching conditions for reduction of the height of the horn can be achieved by Design Of Experiment (DOE).

According to the above-described embodiments, it is possible to minimize the horn of the recess region even when the trench is formed at an angle of approximately 90° or less in the STI process.

Also, it is possible to further increase the channel length by forming the recess region with a dual profile.

It is also possible to minimize the field oxide loss of the region of a passing gate while reducing the horn. The passing gate is a gate electrode that intersects the top of the device isolation layer adjacent to the end of the active region. The field oxide loss can be prevented because the second etching has a high selectivity with respect to the device isolation layer that is formed of an oxide layer.

As described above, the present invention can minimize the horn of the recess region even when the trench is formed at an angle of approximately 90° or less in the STI process. Thus, the present invention can prevent the characteristic degradation of the gate insulating layer and the stress concentration due to the characteristic degradation of the gate insulating layer.

Embodiments of the present invention can further increase the channel length by forming the recess region with a dual profile.

Embodiments of the present invention can also minimize the field oxide loss of the region of the passing gate while reducing the horn. Thus, embodiments of the present invention can improve the characteristics of the semiconductor device.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a recess gate in a semiconductor device, the method comprising:
    etching a silicon substrate to form a trench that defines an active region;
    forming a device isolation layer that gap-fills the trench;
    forming a hard mask layer over the silicon substrate and the device isolation layer, the hard mask layer comprising a stack of an oxide layer and an amorphous carbon layer formed over the oxide layer, wherein the hard mask layer exposes a channel target region of the active region;
    forming a first recess region by performing a first etching process on the channel target region by using the hard mask layer as an etch barrier;
    removing the amorphous carbon layer; and
    forming a second recess region by performing a second etching process on the first recess region as exposed by said first etching and said removing the amorphous carbon layer by using the hard mask layer as an etch barrier, wherein the first and second recesses form a combined recess region with a dual profile,
    wherein the second etching is performed after removing the amorphous carbon layer.

2. The method of claim 1, further comprising, after the second etching, a third etching process in situ to increase a width of the second recess region.

3. The method of claim 1, wherein:
    the amorphous carbon layer is used as an etch barrier during the formation of the first recess region;
    the oxide layer is used as an etch barrier during the formation of the second recess region; and
    the second recess region is wider than the first recess region.

4. The method of claim 3, wherein the first etching, the removing of the amorphous carbon layer, and the second etching are performed in situ in a plasma etching apparatus.

5. The method of claim 4, wherein the first etching and the second etching are performed using a mixture of chlorine-based gas and bromine-based gas.

6. The method of claim 5, wherein the first etching and the second etching are performed at an HBr-to-$Cl_2$ flow rate ratio of approximately 5:1, by applying a pressure of approximately 5 mtorr to approximately 20 mtorr, a source power of approximately 500 W to approximately 1500 W, and a bias power of approximately 100 V to approximately 300 V.

7. The method of claim 4, wherein the removing of the amorphous carbon layer is performed using an $O_2$ plasma with a flow rate of approximately 200 sccm to approximately 1000 sccm and by applying a source power without applying a bias power.

8. The method of claim 2, wherein the third etching is performed by adding a mixture of fluorine-based gas and oxygen gas to a mixture of chlorine-based gas and bromine-based gas.

9. The method of claim 8, wherein the fluorine-based gas comprises one of sulfur fluoride gas, nitrogen fluoride gas, and carbon fluoride gas.

10. The method of claim 8, wherein the third etching is performed by applying a pressure of approximately 20 mtorr to approximately 100 mtorr, a source power of approximately 500 W to approximately 1500 W, and a bias power of approximately 50 W or less.

11. The method of claim 8, wherein the bromine-based gas is HBr and the chorine-based gas is $Cl_2$.

12. The method of claim 4, wherein the plasma etching apparatus uses one of Magnetically Enhanced Reactive Ion Etching (MERIE), Transformer Coupled Plasma (TCP), Inductively Coupled Plasma (ICP), Microwave Down Stream (MDS), Electron Cyclotron Resonance (ECR), and Helical as a plasma source.

13. A method for forming a recess channel in a semiconductor device, the method comprising:
    forming a hard mask layer over a semiconductor substrate, the hard mask layer comprising a stack of a passivation layer and an amorphous carbon layer formed over the passivation layer, wherein the hard mask layer exposes a channel target region of the semiconductor substrate;
    etching the channel target region using the amorphous carbon layer as an etch barrier to form a first recess region;
    removing the amorphous carbon layer; and
    etching a bottom of the first recess region by etching the first recess region as exposed by said etching the channel target region and said removing the amorphous carbon layer by using the passivation layer as an etch barrier to form a second recess region.

14. The method of claim 13, wherein the etching the channel target region, the removing of the amorphous carbon layer, and the etching the bottom of the first recess region are performed in situ in a plasma etching apparatus.

15. The method of claim 14, wherein the etching the channel target region and the etching the bottom of the first recess region are performed using the same etch gas, the same pressure, the same source power, and the same bias power.

16. The method of claim 14, wherein the removing of the amorphous carbon layer is performed using an $O_2$ plasma and by applying a source power without applying a bias power.

17. The method of claim 14, wherein the plasma etching apparatus uses one of Magnetically Enhanced Reactive Ion Etching (MERIE), Transformer Coupled Plasma (TCP), Inductively Coupled Plasma (ICP), Microwave Down Stream (MDS), Electron Cyclotron Resonance (ECR), and Helical as a plasma source.

18. The method of claim 13, wherein the semiconductor substrate comprises a silicon substrate and the passivation layer comprises an oxide layer.

19. The method of claim 13, further comprising, after etching the bottom of the first recess region, performing etching in situ to increase a width of the second recess region.

20. A method for fabricating a recess gate in a semiconductor device, the method comprising:
   etching a silicon substrate to form a trench that defines an active region;
   forming a device isolation layer in the trench;
   forming a hard mask layer over the silicon substrate and the device isolation layer, the hard mask layer comprising an oxide layer and an amorphous carbon layer formed over the oxide layer, wherein the hard mask layer exposes a channel target region of the active region;
   first etching the channel target region using the amorphous carbon layer as an etch barrier to form a first recess region;
   removing the amorphous carbon layer;
   second etching a bottom of the first recess region by etching the first recess region as exposed by said first etching and said removing the amorphous carbon layer by using the oxide layer as an etch barrier to form a second recess region, wherein the second recess region is wider than the first recess region.

21. The method of claim 20, further comprising third etching the recess region to widen the second recess region.

22. A method for forming a recess channel in a semiconductor device, the method comprising:
   forming a hard mask layer over a semiconductor substrate, the hard mask layer comprising a passivation layer and an amorphous carbon layer formed over the passivation layer, wherein the hard mask layer exposes a channel target region of the semiconductor substrate;
   etching the channel target region using the amorphous carbon layer as an etch barrier to form a first recess region;
   removing the amorphous carbon layer; and
   etching a bottom of the first recess region by etching the first recess region as exposed by said first etching and said removing the amorphous carbon layer by using the passivation layer as an etch barrier to form a second recess region, wherein the second recess region is wider than the first recess region.

23. The method of claim 22, further comprising etching sides of the second recess region to increase a width of the second recess region.

* * * * *